(12) United States Patent
Obi et al.

(10) Patent No.: US 7,067,239 B2
(45) Date of Patent: Jun. 27, 2006

(54) MICRO ELECTRICAL MECHANICAL SYSTEMS

(75) Inventors: Samuel Obi, Zurich (CH); Michael Gale, Wettswil (CH)

(73) Assignee: CSEM Centre Suisse d'Electronique et de Microtechnique S.A., Neuchatel (CH)

( * ) Notice: Subject to any disclaimer, the term of this patent is extended or adjusted under 35 U.S.C. 154(b) by 384 days.

(21) Appl. No.: 10/461,825

(22) Filed: Jun. 13, 2003

(65) Prior Publication Data

US 2004/0055151 A1    Mar. 25, 2004

(51) Int. Cl.
*G02B 26/00* (2006.01)

(52) U.S. Cl. .................. 430/321; 430/315; 430/319; 216/1.38; 216/1.24; 216/1.27

(58) Field of Classification Search ............... None
See application file for complete search history.

(56) References Cited

U.S. PATENT DOCUMENTS

| | | | |
|---|---|---|---|
| 5,821,003 A | 10/1998 | Uemura et al. | |
| 5,905,007 A | 5/1999 | Ho et al. | |
| 6,383,833 B1 | 5/2002 | Silverbrook | |
| 6,387,787 B1 | 5/2002 | Mancini et al. | |
| 6,706,202 B1* | 3/2004 | Sun et al. ................ | 216/24 |
| 2003/0021004 A1* | 1/2003 | Cunningham et al. ...... | 359/290 |

FOREIGN PATENT DOCUMENTS

WO    02 06902    1/2002

OTHER PUBLICATIONS

Gale, M.T., "Replication", *Micro-Optics: Elements, Systems and Applications*, Chapter 6, H.P. Herzig, Ed., Taylor and Francis, London, ISBN 0-7484-0481-3 HB, 1997.

Popall, M., et al., "ORMOCER®S—Inorganic-Organic Hybrid Materials for e/o-Interconnection-Technology", *Mol. Cryst. and Liq. Cryst.*, vol. 354, pp. 123-142, 2000.

"Novel European materials and technologies enable high performance optical, electrical and opto/electrical integration", *ORMOCER®S—New inorganic-organic hybrid polymers*, pamphlet, 2000.

Guckel, H., et al., "Diagnostic microstructures for the measurement of intrinsic strain in thin films", *J. Micromech. Microeng.*, 2:86-95 (1992).

* cited by examiner

*Primary Examiner*—John A. McPherson
(74) *Attorney, Agent, or Firm*—Fish & Richardson P.C.

(57) ABSTRACT

A method for fabricating optical MEMS (optical Micro-Electro-Mechanical Systems or Micro-Opto-Electro-Mechanical Systems (MOEMS)) is described. The basic process involves deposition and patterning of a sacrificial spacer layer and a combined molding and photolithography step.

The method described allows the fabrication of micromechanical elements incorporating micro-optical structures such as lenses (diffractive or refractive), gratings (for polarizers or resonant filters), waveguides or other micro-optical relief structures fabricated by UV-curing replication processes.

18 Claims, 2 Drawing Sheets a b c d

MICRO ELECTRICAL MECHANICAL SYSTEMS

The invention relates to the fabrication of Micro Systems such as micro electro mechanical systems (MEMS) particularly, but not exclusively, for applications in optical systems for areas such as telecommunications, image projectors, sensors and optical instruments.

Micro-Electro-Mechanical Systems (MEMS) of today are fabricated using well-established technologies from the semiconductor industry, namely photolithography, thin film deposition and oxidation, dry and wet etching as well as bonding and packaging techniques.

The design of optical MEMS or micro opto electro mechanical systems (MOEMS) is dictated by the fabrication technologies available. For example the flat surfaces produced by the above mentioned technologies are commonly used as mirrors. Other examples of optical MEMS use optical elements integrated by micro-assembly (optical fibres, microlenses, ball-lenses, etc).

In micro-optics, on the other hand, different kinds of fabrication technologies have been established. Modern micro-optics and micro-optical systems can be fabricated in large volume using so-called replication methods. For information on these methods reference should be made to M. T. Gale, Replication, Ch. 6 in Micro-Optics: Elements, systems and applications, H. P. Herzig, Ed., Taylor and Francis, London, 1997, ISBN 0 7484 0481 3 HB. An original master is copied via a mould to produce a very large number of replicas by embossing, casting or injection moulding. Security holograms and CDs are well known examples. Such techniques, however, are difficult to apply to features that are undercut as release of the mould is a problem.

In one aspect the invention provides a method of fabrication of optical Micro-Electro-Mechanical Systems (optical MEMS/MOEMS), comprising the steps of:

i) deposition and patterning of a sacrificial spacer layer,
ii) structuring an UV-curable casting material by a combined moulding and photolithography step on top of the sacrificial spacer layer.

With this process, a 3D relief is monolithically integrated on top of the resulting free-standing microstructures.

In a second aspect the invention provides a method of fabricating micro electrical mechanical system comprising the steps:

forming a patterned sacrificial layer including an aperture on a substrate,
dispensing a UV-curable casting material on the sacrificial layer including the aperture,
moulding the casting material to form a desired three-dimensional structure,
curing the moulded structure, and
removing the sacrificial layer and any uncured casting material.

The present invention enables the avoidance of the use of silicon substrates and silicon photolithographic processing technology, and enables MOEMS to be fabricated on any substrate material (for example glass, fused silica, GaAs) and enables the fabrication of MOEMS microstructure, including optical microstructure, by a reduced number of processing steps. The advantage lies in the potential for lower cost production, as well as the increased flexibility in the choice of substrate material.

The sacrificial layer may consist of a photo resistive layer, which may comprise a thin film metal or oxide layer.

The casting material may be a photosensitive sol-gel material. An example of such a material is ORMOCER®. ORMOCER® is a registered trademark of the Fraunhofer-Gesellschaft in Germany.

A paper by M. Popall, A. Dabek, M. E. Robertsson, S. Valizadeh, O. J. Hagel, R. Buestrich, R. Nagel, L. Cergel, D. Lambert, M. Schaub, "ORMOCER®s—inorganic-organic hybrid materials for e/o interconnection technology", Mol. Cryst. and Liq. Cryst., 354, 123–142 (2001) describes the use of the material in electrical and optical applications.

The method may comprise the further step of depositing one or more metallic patterns to the three dimensional structure to form electrical contacts and/or electrodes.

The three dimensional structure may comprise one or more of lenses (diffraction or refraction), gratings, waveguides, or other micro optical structures.

The invention further provides a micro electro mechanical system including an actuator, the actuator comprising a three dimensional structure formed on a substrate by a method according to the invention and means for applying electrical potentials to the contacts and/or electrodes, the structure being such that the application of the electrical potentials to the contacts and/or electrodes causes movement of at least part of the three dimensional structure.

Such a structure enables the production of micro actuators where a part of the structure may be moved by electrical forces such as electrostatic, electromagnetic, or piezo electric forces.

The invention yet further provides a measurement device comprising a micro electro mechanical system and a monitoring device, wherein the micro electro mechanical system comprises a three dimensional structure formed on a substrate by a method according to the invention, and the monitoring device is arranged for connection to the electrical contacts to detect electrical potentials and/or currents caused by forces acting on at least part of the three dimensional structure.

Such a device enables the measurement of forces applied to at least part of the structure, for example by measuring the deflection of part of the structure in response to a force applied thereto by detecting a change in capacitance between two electrodes, one on a rigid portion of the structure or substrate and the other on a flexible part of the structure. There are, of course, many other ways of detecting forces on a part of the structure and producing an electrical output in response thereto that would be apparent to the skilled person.

Embodiments of the invention will now be described by way of example, with reference to the accompanying drawings, in which:

FIG. 1 shows the steps of a process of fabricating MEMS according to the invention.

FIG. 2a shows ORMOCER® Cantilever beam: Beam length 1 mm, width 20 μm, height 100 μm, the gap under the beam being about 10 μm, fabricated by the method of FIG. 1.

FIG. 2b shows ORMOCER® Cantilever beam with a micro lens on top: length 1 mm, width 200 µm, height 50 µm, gap 10 µm fabricated by the method of FIG. 1.

Figure 1:
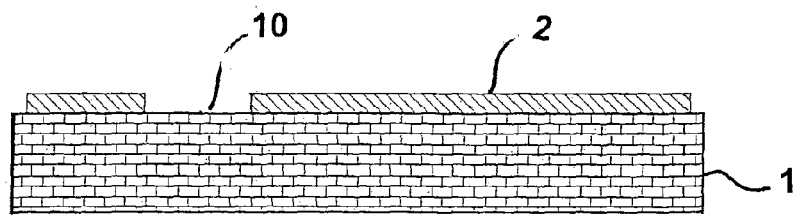
FIG. 1 illustrates the steps in a method for fabricating optical MEMS (optical Micro-Electro-Mechanical Systems or MOEMS) according to the invention.
Figure 1:
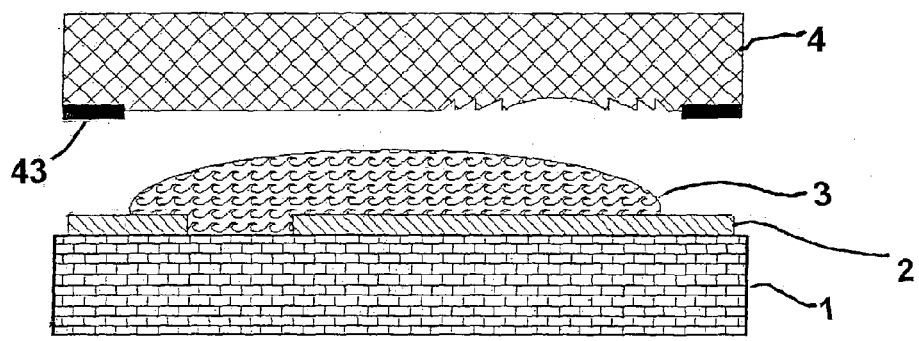
Figure 1:
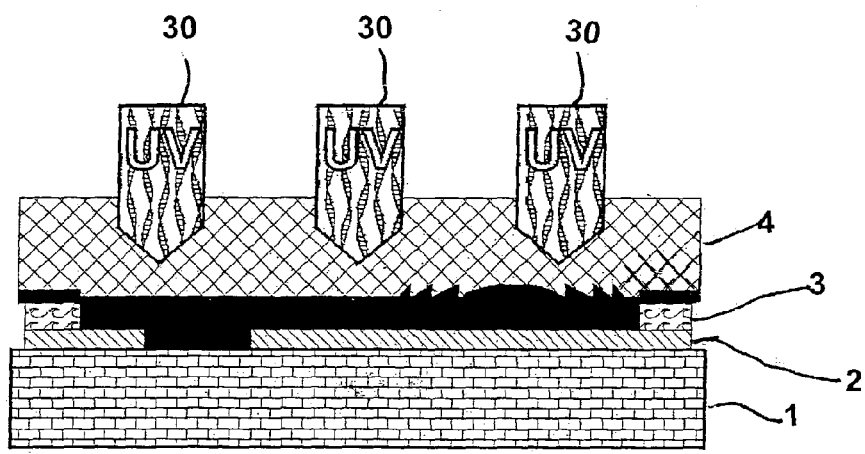
Figure 1:
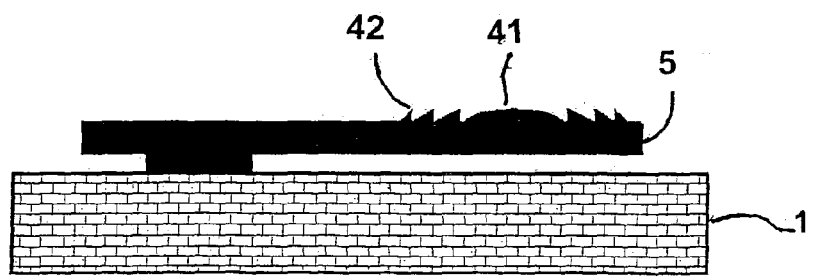

The first step of the method, shown in FIG. 1a is the coating of the basic substrate 1 with a so-called sacrificial layer 2. A temporary carrier layer, the sacrificial layer 2, is coated on a substrate 1. This layer has at least one aperture 10 that extends to the surface of the substrate 1.

This step may be carried out using a standard photolithography process. Using such processes the layer may typically be up to 20 µm in thickness.

The second step of the method, shown in FIG. 1b, is the casting or moulding of the microstructure. The casting material 3 is dispensed onto the sacrificial layer 2. This casting material is curable by UV radiation, and may be, for example a sol-gel material.

A mould master 4 that may consist of a standard photolithography mask combined with 3D optical microstructures is lowered over the dispensed casting material 3 to mould the cast material into the desired shape. The original micro-optical structures may be fabricated using resist re-flow processing (refractive lenses) or holography (nano-scale gratings) and then be moulded directly onto a commercially available photolithography mask to form the mould master 4. The mould master 4 may also have non-transparent layers 43 to define the outer limits of the structure to be moulded.

The third step of the method shown in FIG. 1c is the UV-exposure of the casting material 3. By illuminating the casting material with UV light 30 through the mould mask 4, which is made from a UV transparent material, the exposed parts 5 are cured. The height of the final structure is determined by the layer thickness of the casting material. With this method, heights between 50 µm and 200 µm have been realised in experimental structures.

The fourth step of the method is shown in FIG. 1d and is the development of the casting material held between the mould 4 and the substrate 1/sacrificial layer 2. After removing the mould master 4, the substrate is immersed in developer solution and the unexposed casting material 3 as well as the sacrificial layer 2 are dissolved. Finally, the structures are baked in an oven. This leaves a 3D structure that is moulded on a substrate 1. The provision of the sacrificial layer enables the construction of structures having a gap between part of its lower surface and the substrate.

To obtain optical Micro Electro Mechanical Systems (MOEMS) requiring metal layers for electrostatic, electromagnetic, or other actuators, further processing may be carried out using known conventional processes to form metal layers on the substrate and/or three dimensional structures. Thus the metal layers may create contacts or electrodes enabling movement of part of the structure by applying electrical potentials to the contacts or electrodes, or enabling measurement of the displacement of parts of the structure.

The 3D structure 5 as shown in FIG. 1d comprises a cantilever beam having a lens 41 and an optical diffraction structure 42 formed integrally with the beam.

The following structures have been realised with the described fabrication method, using the sol-gel moulding material ORMOCER® (a UV-curable inorganic-organic polymer developed for optical applications).

Figure 2A:
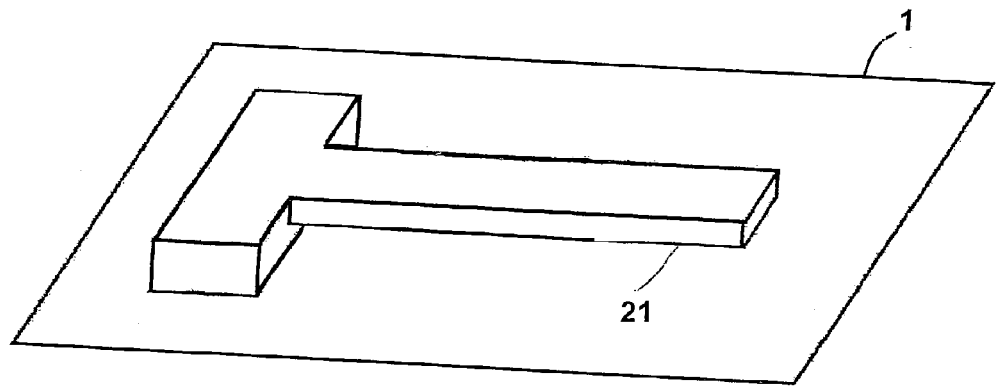
FIG. 2c shows ORMOCER® cantilever beam with a micro lens on top and metal electrodes.

A cantilever beam 21 (FIG. 2a)

Figure 2B:
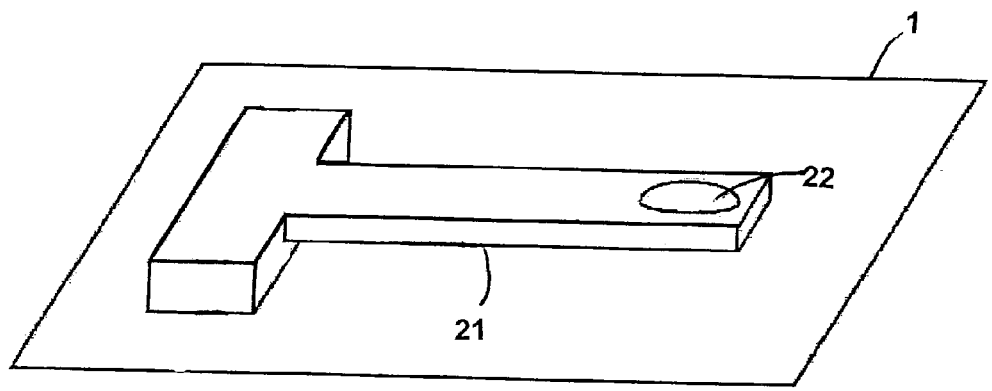

A cantilever beam 21 with a micro lens 22 on top (FIG. 2b)

Figure 2C:
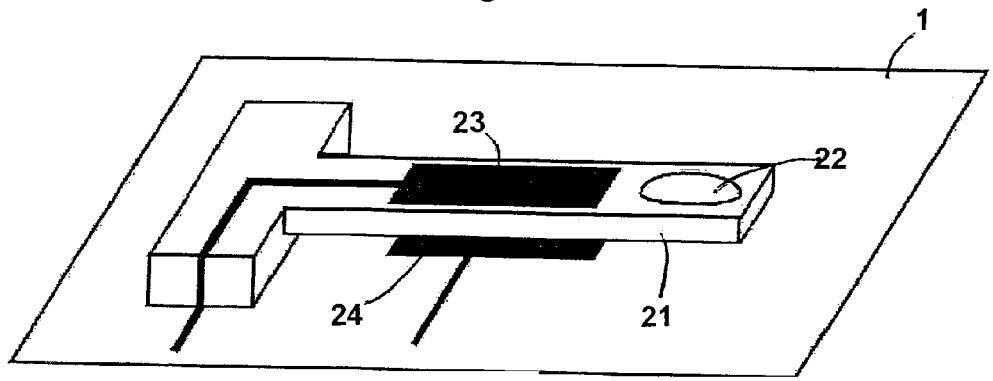

A cantilever beam 21 with a micro lens 22 on top and two electrodes 23, 24 (FIG. 2c).

The invention claimed is:

1. A method of fabricating micro electro mechanical systems (MEMS) comprising the steps of;
   forming a patterned sacrificial layer including an aperture on a substrate,
   dispensing a UV-curable casting material on the sacrificial layer including the aperture,
   moulding the casting material to form a desired three-dimensional structure,
   curing the moulded structure, and
   removing the sacrificial layer and any uncured casting material.

2. A method as claimed in claim 1 in which the sacrificial layer consists of a photo resistive layer.

3. A method as claimed in claim 2 comprising the further step of depositing one or more metallic patterns to the three dimensional structure to form electrical contacts.

4. A method as claimed in claim 2 comprising the further step of depositing one or more metallic patterns to the three dimensional structure to form electrodes.

5. A method as claimed in any claim 2 in which the three dimensional structure comprises one or more of lenses (diffraction or refraction), gratings, wave-guides, or other micro-optical structures.

6. A method as claimed in claim 1 in which the sacrificial layer comprises a thin film metal layer.

7. A method as claimed in any claim 6 in which the three dimensional structure comprises one or more of lenses (diffraction or refraction), gratings, wave-guides, or other micro-optical structures.

8. A method as claimed in claim 1 in which the sacrificial layer comprises an oxide layer.

9. A method as claimed in any claim 8 in which the three dimensional structure comprises one or more of lenses (diffraction or refraction), gratings, wave-guides, or other micro-optical structures.

10. A method as claimed in any claim 1 in which the casting material is a photosensitive sol-gel material.

11. A method as claimed in claim 10 comprising the further step of depositing one or more metallic patterns to the three dimensional structure to form electrical contacts.

12. A method as claimed in claim 10 comprising the further step of depositing one or more metallic patterns to the three dimensional structure to form electrodes.

13. A method as claimed in any claim 10 in which the three dimensional structure comprises one or more of lenses (diffraction or refraction), gratings, wave-guides, or other micro-optical structures.

14. A method as claimed in claim 1 comprising the further step of depositing one or more metallic patterns to the three dimensional structure to form electrical contacts.

15. A method as claimed in any claim 14 in which the three dimensional structure comprises one or more of lenses (diffraction or refraction), gratings, wave-guides, or other micro-optical structures.

16. A method as claimed in claim 1 comprising the further step of depositing one or more metallic patterns to the three dimensional structure to form electrodes.

17. A method as claimed in any claim 16 in which the three dimensional structure comprises one or more of lenses (diffraction or refraction), gratings, wave-guides, or other micro-optical structures.

18. A method as claimed in any claim 1 in which the three dimensional structure comprises one or more of lenses (diffraction or refraction), gratings, wave-guides, or other micro-optical structures.

* * * * *

UNITED STATES PATENT AND TRADEMARK OFFICE
CERTIFICATE OF CORRECTION

PATENT NO. : 7,067,239 B2  
APPLICATION NO. : 10/461825  
DATED : June 27, 2006  
INVENTOR(S) : Samuel Obi and Michael Gale Page 1 of 1

It is certified that error appears in the above-identified patent and that said Letters Patent is hereby corrected as shown below:

On Title page  
Add the following to the first page of the Letters Patent:

Item (30)  Foreign Application Priority Data

Jun. 14, 2002   (UK) ………………………………..0213722.2

Signed and Sealed this

Thirty-first Day of October, 2006

JON W. DUDAS  
*Director of the United States Patent and Trademark Office*